United States Patent
Gathman et al.

(10) Patent No.: US 10,439,593 B2
(45) Date of Patent: Oct. 8, 2019

(54) MULTI-BAND FILTER ARCHITECTURES

(71) Applicant: QUALCOMM Incorporated, San Diego, CA (US)

(72) Inventors: Timothy Donald Gathman, San Diego, CA (US); Lai Kan Leung, San Marcos, CA (US); Chirag Dipak Patel, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 15/712,406

(22) Filed: Sep. 22, 2017

(65) Prior Publication Data

US 2019/0097608 A1    Mar. 28, 2019

(51) Int. Cl.
| | | |
|---|---|---|
| *H03H 11/08* | (2006.01) | |
| *H03H 11/42* | (2006.01) | |
| *H04B 1/48* | (2006.01) | |
| *H04B 5/00* | (2006.01) | |
| *H03H 11/04* | (2006.01) | |
| *H03H 11/34* | (2006.01) | |

(52) U.S. Cl.
CPC .......... *H03H 11/08* (2013.01); *H03H 11/0444* (2013.01); *H03H 11/42* (2013.01); *H04B 1/48* (2013.01); *H04B 5/0012* (2013.01); *H04B 5/0075* (2013.01); *H03H 11/342* (2013.01); *H03H 2011/0494* (2013.01)

(58) Field of Classification Search
CPC ................................ H03H 11/08; H03H 11/42
See application file for complete search history.

(56) References Cited

U.S. PATENT DOCUMENTS

| | | | | |
|---|---|---|---|---|
| 4,701,732 A | * | 10/1987 | Nestlerode | H03J 5/244 327/434 |
| 6,825,722 B2 | * | 11/2004 | Segawa | H03D 7/1441 330/253 |
| 7,002,403 B2 | * | 2/2006 | Marholev | H03H 11/0422 327/552 |
| 7,187,240 B2 | * | 3/2007 | Cathelin | H03B 5/366 331/107 A |
| 7,215,227 B2 | | 5/2007 | Dong | |
| 7,266,351 B2 | | 9/2007 | Marholev | |

(Continued)

FOREIGN PATENT DOCUMENTS

| | | |
|---|---|---|
| CN | 103326693 A | 9/2013 |
| WO | 2004105234 A1 | 12/2004 |

OTHER PUBLICATIONS

Jeon O., "Analog Baseband Processor for CMOS 5-GHZ WLAN Receiver", A Dissertation Presented to the Graduate School of the University of Florida in Partial Fulfillment of the Requirements for the Degree of Doctor of Philosophy, 2005, 125 Pages.

(Continued)

*Primary Examiner* — Dean O Takaoka
*Assistant Examiner* — Alan Wong
(74) *Attorney, Agent, or Firm* — Patterson & Sheridan, L.L.P.

(57) ABSTRACT

Certain aspects of the present disclosure relate to multi-band filter architectures and methods for filtering signals using the multi-band filter architectures. One example multi-band filter generally includes a transconductance-capacitance (gm-C) filter and a reconfigurable load impedance coupled to an output of the gm-C filter, the reconfigurable load impedance comprising a first gyrator circuit coupled to a second gyrator circuit.

25 Claims, 15 Drawing Sheets

(56) References Cited

U.S. PATENT DOCUMENTS

| | | | |
|---|---|---|---|
| 7,436,260 B2* | 10/2008 | Chamla | H03F 1/3211 |
| | | | 330/124 R |
| 8,390,371 B2 | 3/2013 | Ardehali | |
| 8,847,676 B2 | 9/2014 | Jalaleddine | |
| 9,148,185 B2* | 9/2015 | Taya | H04B 1/1036 |
| 9,559,735 B2* | 1/2017 | Park | H03H 7/0153 |
| 9,698,738 B2* | 7/2017 | Han | H03H 11/0466 |
| 10,128,819 B2* | 11/2018 | Hedayati | H03H 19/002 |
| 2007/0182480 A1 | 8/2007 | Kimura et al. | |
| 2014/0015602 A1 | 1/2014 | Alzaher et al. | |

OTHER PUBLICATIONS

Zhao T., et al., "Design of a Programmable and Low-Frequency Filter for Biomedical Signal Sensing Applications", IEEE 9th International Congress on Image and Signal Processing, BioMedical Engineering and Informatics, 2016, pp. 1746-1750.

Behbahani F., et al., "A Broad-Band Tunable CMOS Channel-Select Filter for a Low-IF Wireless Receiver", IEEE Journal of Solid-State Circuits, IEEE Service Center, Piscataway, NJ, USA, vol. 35, No. 4, Apr. 1, 2000 (Apr. 1, 2000), pp. 476-489, XP011450217, ISSN: 0018-9200, DOI: 10.1109/4.839908, IV. Low-Pass Filter Design.

International Search Report and Written Opinion—PCT/US2018/048324—ISA/EPO—dated Nov. 14, 2018.

Schaumann R., "Simulating Lossless Ladders with Transconductance-C Circuits", IEEE Transactions on Circuits and Systems II: Analog and Digitalsignal Processing, Institute of Electrical and Electronics Engineers Inc, 345 East 47 Street, New York, N.Y. 10017, USA, vol. 45, No. 3, Mar. 1, 1998 (Mar. 1, 1998), pp. 407-410, XP011012800, ISSN: 1057-7130, II. Arbitrary LC Ladder Structures; III. The General Shunt and Series Ladder Arms.

\* cited by examiner

MULTI-BAND FILTER ARCHITECTURES

TECHNICAL FIELD

The present disclosure relates generally to electronic circuits, and more particularly to multi-band filter architectures.

BACKGROUND

Wireless communication networks are widely deployed to provide various communication services such as telephony, video, data, messaging, broadcasts, and so on. A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or the mobile station may include one/or more filter circuits, such as baseband filters.

SUMMARY

Certain aspects of the present disclosure generally relate to reconfigurable multi-band filters. The multi-band filters may be implemented with one or more gyrator circuits, as described herein.

Certain aspects of the present disclosure provide a multi-band filter. The multi-band filter generally includes a transconductance-capacitance (gm-C) filter and a reconfigurable load impedance coupled to an output of the gm-C filter, the reconfigurable load impedance comprising a first gyrator circuit coupled to a second gyrator circuit.

Certain aspects of the present disclosure provide a multi-band filter. The multi-band filter generally includes a first circuit path comprising a first gm-C filter and a first gyrator circuit coupled to an output of the first gm-C filter, a second circuit path comprising a second gm-C filter and a second gyrator circuit coupled to an output of the second gm-C filter, and a filter circuit coupled between the first gyrator circuit and the second gyrator circuit.

Certain aspects of the present disclosure provide a method of processing an input signal. The method generally includes configuring a multi-band filter to have a first configuration, the multi-band filter comprising a gm-C filter and a reconfigurable load impedance coupled to an output of the gm-C filter, the reconfigurable load impedance comprising a first gyrator circuit coupled to a second gyrator circuit; and filtering the input signal with the multi-band filter in the first configuration.

Certain aspects of the present disclosure provide a method for processing a first input signal and a second input signal. The method generally includes filtering the first input signal and the second input signal with a multi-band filter. The multi-band filter generally includes a first circuit path comprising a first gm-C filter and a first gyrator circuit coupled to an output of the first gm-C filter, a second circuit path comprising a second gm-C filter and a second gyrator circuit coupled to an output of the second gm-C filter, and a filter circuit coupled between the first gyrator circuit and the second gyrator circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements described in one aspect may be beneficially utilized in other aspects without specific recitation.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure described herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure described herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
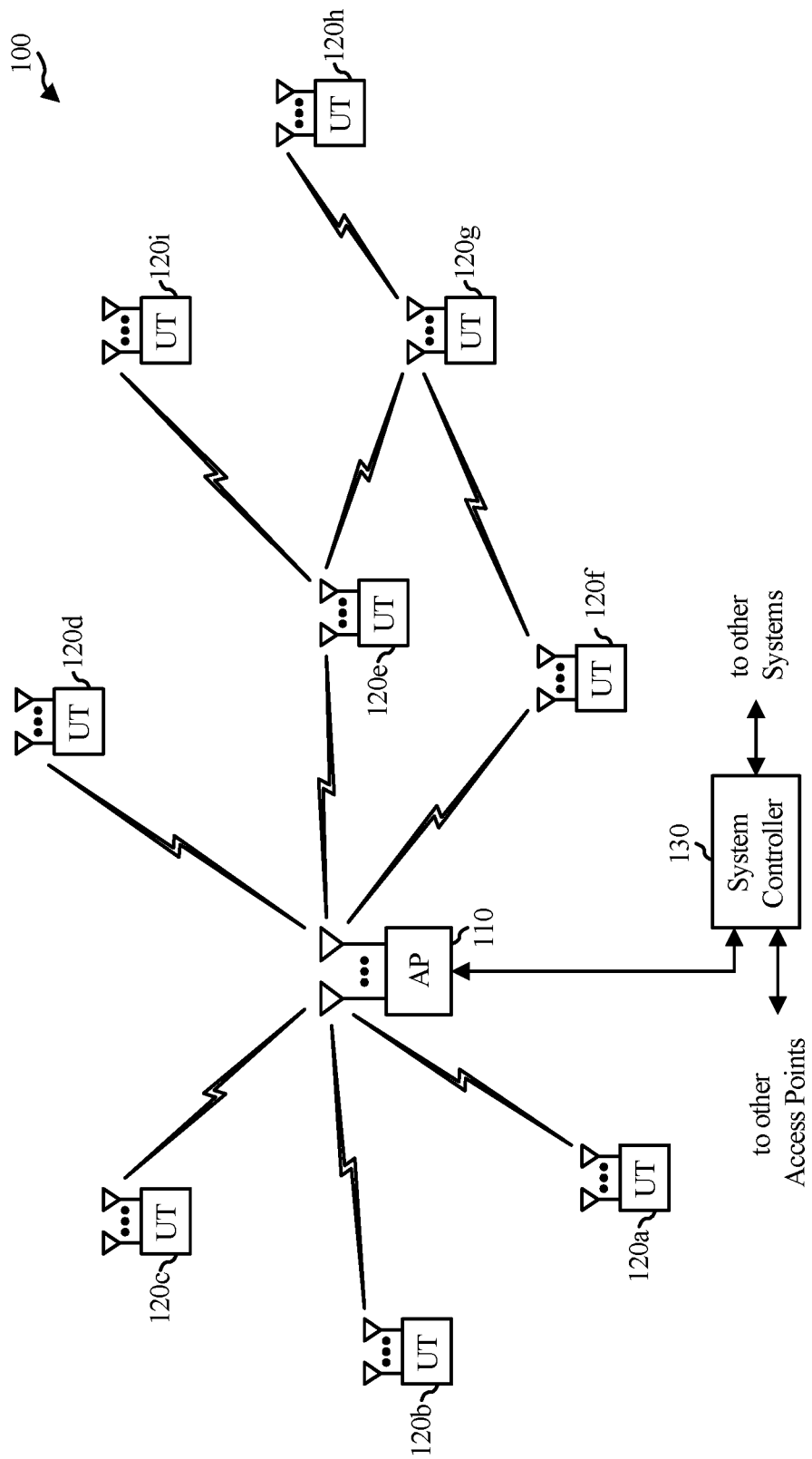
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include a multi-band filter implemented with one or more gyrator circuits, as described herein. For certain aspects, the multi-band filter may be reconfigurable.

Figure 2:
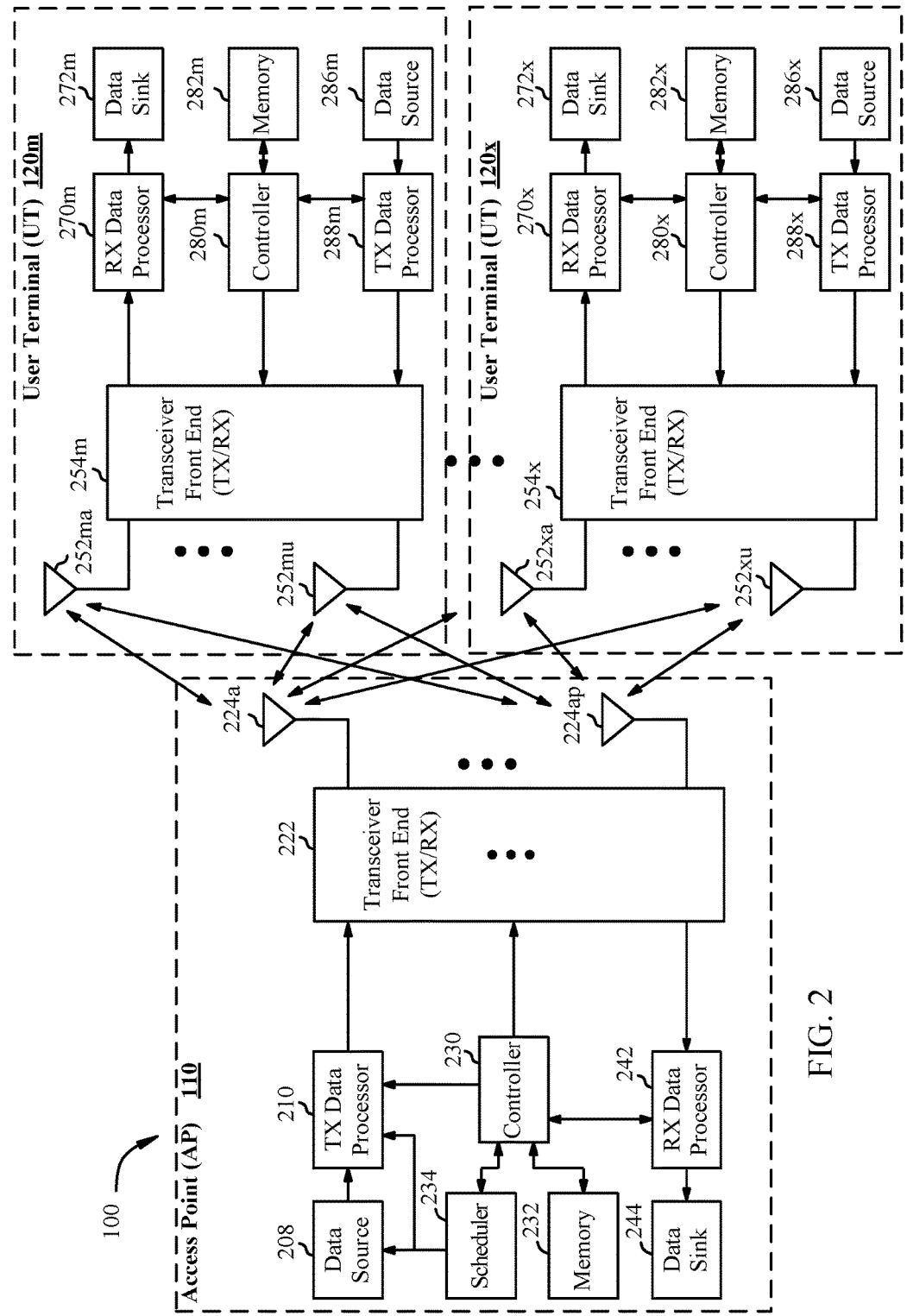
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. The signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front-end (TX/RX) 222 of access point 110 and/or the transceiver front-end 254 of user terminal 120 may include a multi-band filter implemented with one or more gyrator circuits, as described herein. For certain aspects, the multi-band filter may be reconfigurable.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the Nap antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. The signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
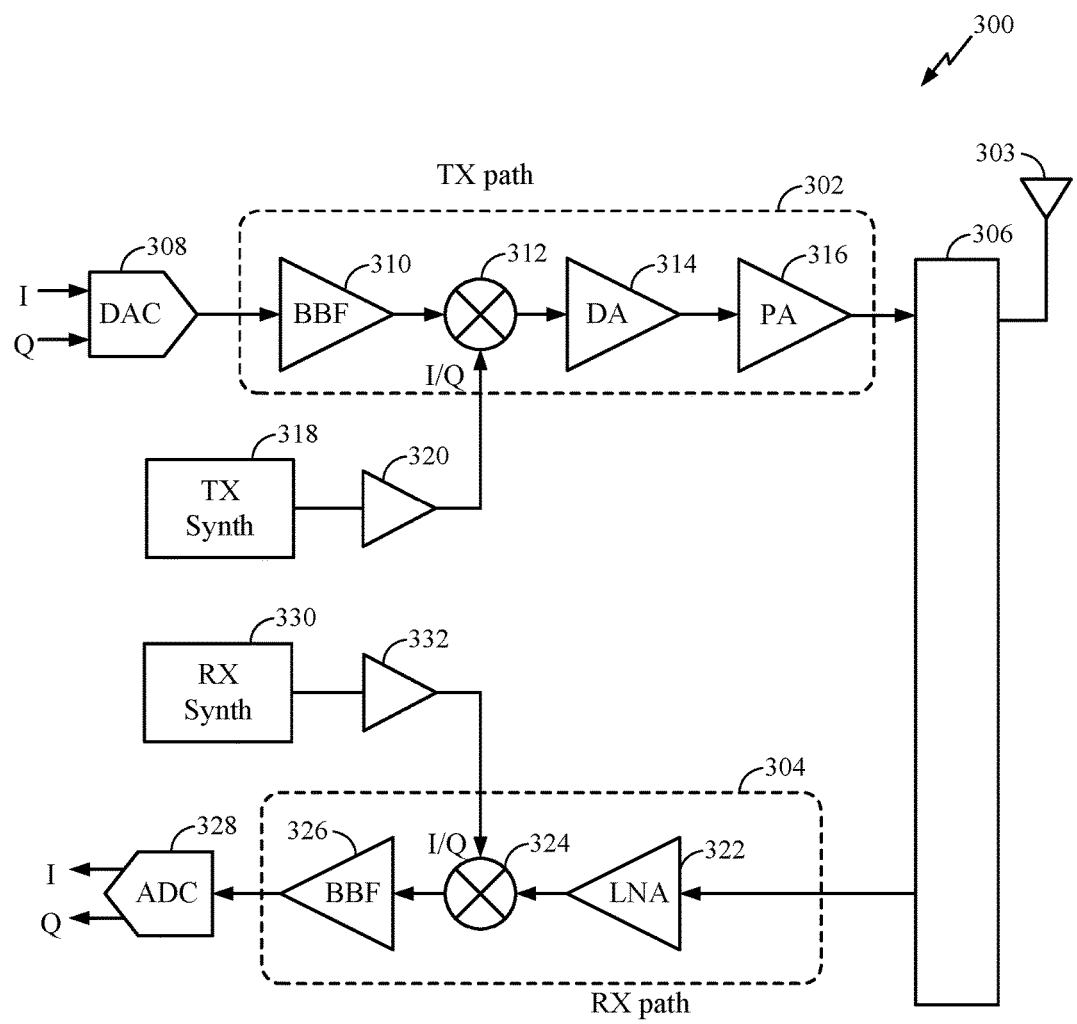
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. The transceiver front-end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

For certain aspects, the BBF 326 may include a multi-band filter implemented with one or more gyrator circuits, as described herein. For certain aspects, the multi-band filter may be reconfigurable to offer different frequency responses.

While it is desirable for the output of an LO to remain stable in frequency, tuning the LO to different frequencies typically involves using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Multi-Band Spectrum

Carrier aggregation is used in some radio access technologies (RATs), such as LTE-A and 5G, in an effort to increase the bandwidth, and thereby increase bitrates. In carrier aggregation, multiple frequency resources (i.e., carriers) are allocated for sending data. Each aggregated carrier is referred to as a component carrier (CC). In LTE Rel-10, for example, up to five component carriers can be aggregated, leading to a maximum aggregated bandwidth of 100 MHz. The allocation of resources may be contiguous or non-contiguous. Non-contiguous allocation may be either intra-band (i.e., the component carriers belong to the same operating frequency band, but have one or more gaps in between) or inter-band, in which case the component carriers belong to different operating frequency bands. To implement CA in radio frequency front-ends (RFFEs), various CA transceivers have been developed.

Figure 4:
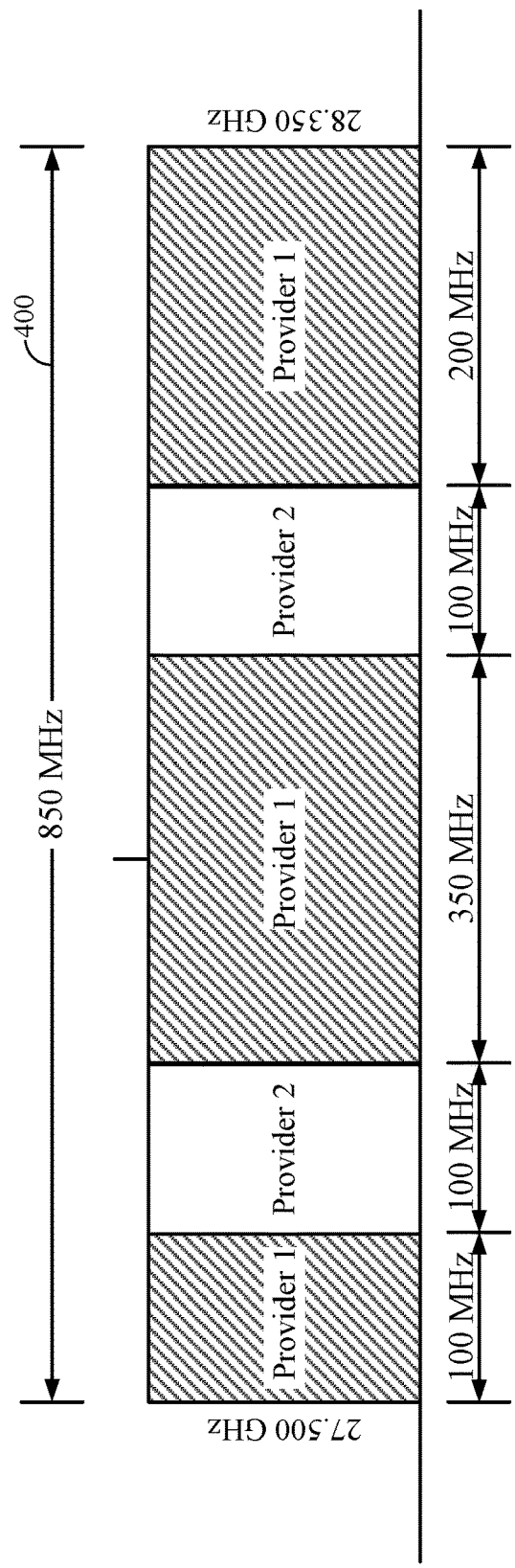
FIG. 4 illustrates an example carrier spectrum, in accordance with certain aspects of the present disclosure.

For certain RATs, the carrier spectrum may be fragmented into two or three spectral chunks/carriers in particular regions of the spectrum. For example, FIG. 4 illustrates an example carrier spectrum 400 for 5G with non-contiguous spectral chunks. 5G is the abbreviation for $5^{th}$-generation mobile networks (or $5^{th}$-generation wireless systems), which are the proposed next telecommunications standards beyond the current 4G/IMT-Advanced (International Mobile Telecommunications-Advanced) standards. In FIG. 4, a first group of aggregated spectral chunks (labeled "Provider 1") and a second group of aggregated spectral chunks (labeled "Provider 2") have alternating sections in the spectrum 400, where all spectral chunks in a designated aggregation may be required to achieve a specified high throughput (faster speed due to increased bandwidth). Thus, it may be desirable to provide massive reconfigurability across carriers, continents, and/or bands and/or to offer the capability of filtering multiple non-contiguous chunks of spectrum.

With traditional architectures, using these non-contiguous carriers for wireless communications may entail multiple receiver (Rx) circuits and local oscillators (LOs). Furthermore, traditional receivers generally have limited flexibility, performance, and/or bandwidth. For example, conventional non-contiguous carrier aggregation (NCCA) Rx architectures may suffer spurious/IMD (intermodulation distortion) desense for two local oscillators (2-LO) (or more) and may only allow two carriers. Traditional single-LO receiver baseband filter (RxBBF) bandpass filter topologies may suffer from desense and limited bandwidth and cannot handle more than two carriers. Also, such scenarios typically require that the carriers have similar bandwidth and be symmetrically spaced around the LO. As another example of a traditional NCCA Rx architecture, one Rx path may be provided per carrier resulting in large die area and IMD/SHD (second harmonic distortion) desense from multiple LO-LO-Tx (transmit) or LO-ACS (adjacent channel selectivity) jammer interactions (typically 2-LO only). Another example involves providing a bandpass filter either in the transimpedance amplifier (TIA) or programmable baseband amplifier (PBA), which may be limited to 2× symmetric carriers. Accordingly, it may be desirable for reconfigurability in an NCCA Rx circuit such that the circuit may handle more than two noncontiguous carriers. Additionally or alternatively, it may be desirable for an NCCA Rx circuit to be capable of switching to open-loop voltage/current-mode filters for 100 MHz+ bandwidth (leading to increased throughput).

Example Multi-Band Filter Architectures

Certain aspects of the present disclosure provide programmable multi-band filter architectures. For example, certain aspects may be able to use a single LO (which offers area and current savings compared to 2-LO) and use high-speed transconductance/capacitance (gm-C) filters to program arbitrary frequency responses for multi-band spectrum scenarios. These architectures may enable the path towards software-defined programmable radio architectures.

Figure 5:
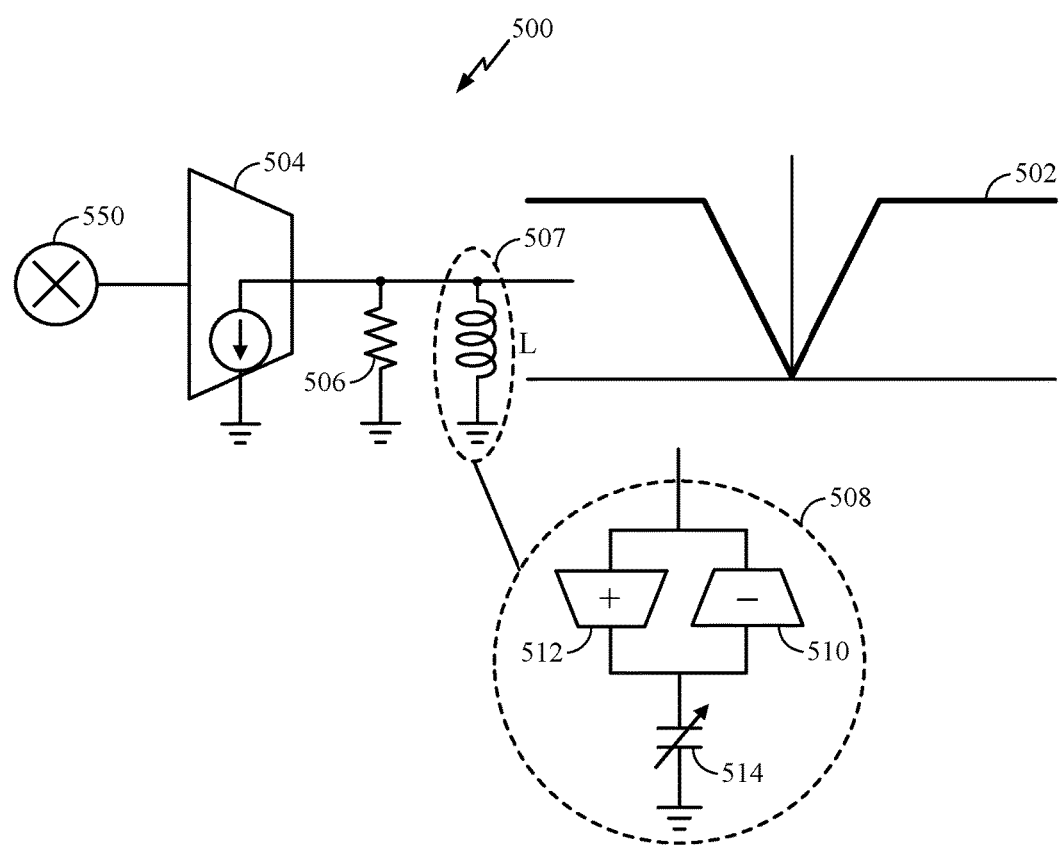
FIG. 5 is a circuit diagram of an example filter circuit and an example single notch frequency response of the filter circuit, in accordance with certain aspects of the present disclosure.
Figure 6:
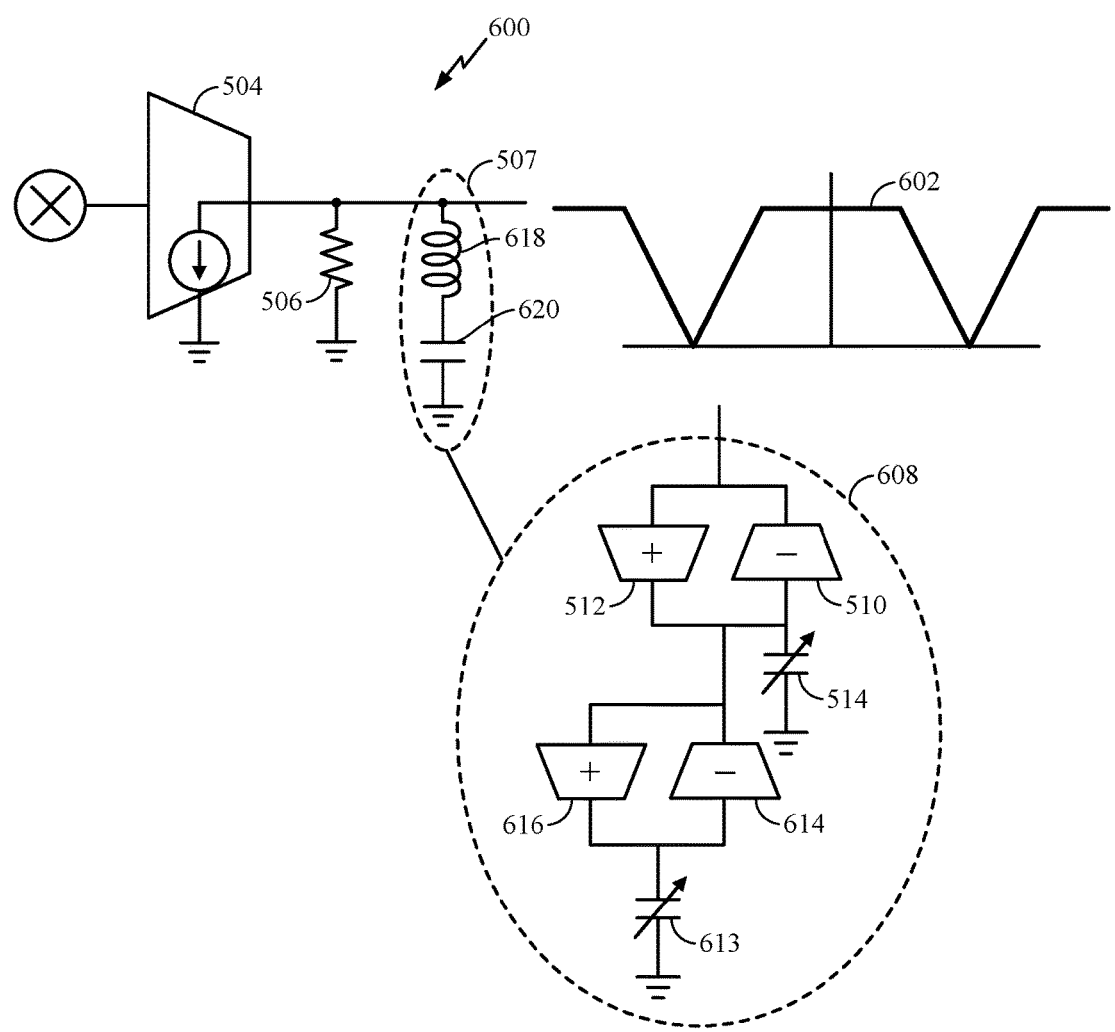
FIG. 6 is a circuit diagram of an example filter circuit and an example double notch frequency response of the filter circuit, in accordance with certain aspects of the present disclosure.

FIGS. 5 and 6 illustrate a portion of a receive path with wideband non-contiguous carrier aggregation (NCCA) filter circuits 500 and 600, which may be reconfigured to implement different responses, in accordance with certain aspects of the present disclosure. Such filter circuits may reconfigure the load impedance of a baseband (BB) voltage-mode or transimpedance filter, such as the BBF 326 of FIG. 3. In FIG. 5, the filter circuit 500 includes a gm-C filter having an output connected to a load impedance, which may include a resistive element 506 (e.g., a resistor) connected in parallel with a reactive element 507. The gm-C filter may include a transconductor 504 and a resistive element and/or a capacitive element coupled thereto (e.g., at the output of the transconductor 504). The reactive element 507 may be implemented with an inductive element providing a shunt inductance (L), as shown in FIG. 5. The inductive element in the filter circuit 500 may be implemented with a gyrator circuit 508 to provide a high-pass response. The gyrator circuit 508 may include a feedforward transconductor 512 (a non-inverting transconductor), a feedback transconductor 510 (an inverting transconductor), and a capacitive element 514 connected as shown. The output of the feedforward transconductor 512 may be connected to the input of the feedback transconductor 510, and the output of the feedback transconductor (gm) may be connected to the input of the feedforward transconductor (e.g., connected in anti-parallel). The capacitive element 514 may have a fixed or a variable capacitance. An input signal (e.g., a baseband signal) may be provided to the filter circuit 500 from a mixer 550, which may be analogous to the mixer 324 in FIG. 3. The mixer 550 may be configured to downconvert a radio frequency (RF) or intermediate frequency (IF) signal to a baseband signal for the filter circuit 500 to act on.

The filter circuit 500 may produce a filter frequency response 502 as shown. The filter circuit 500 may be thought of as a dual high-pass filter, with one high-pass filter for positive frequencies and another high-pass filter for negative frequencies, effectively producing a notch at DC (center line) in the frequency response 502.

As shown in FIG. 6, the filter circuit 600 may include a reactive element 507 implemented by an inductive element 618 and a capacitance element 620 connected in series, providing a shunt series inductance-capacitance (LC). The inductive element connected in series with the capacitive element may be implemented with a double-gyrator circuit 608 to implement a bandstop (a notch) in both positive and negative frequencies of the frequency response 602. Thus, the filter circuit 600 may be considered as a notch filter.

The double-gyrator circuit 608 can reuse circuitry from the gyrator circuit of FIG. 5, such that the filter circuit can be reconfigured to implement either filter circuit 500 or filter circuit 600, for example. Specifically, the double-gyrator circuit 608 may include a first gyrator circuit that includes a feedforward transconductor 512, a feedback transconductor 510, and a capacitive element 514, as described above. The double-gyrator circuit 608 may also include a second gyrator circuit that includes a second feedforward transconductor 616, a second feedback transconductor 614, and a second capacitive element 613 as shown in FIG. 6. The output of the second feedforward transconductor 616 may be connected to the input of the second feedback transconductor 614, and the output of the feedback transconductor may be connected to the input of the feedforward transconductor (e.g., connected in anti-parallel). The capacitive element 613 may have a fixed or a variable capacitance. The output of the feedforward transconductor 512 may be connected to the input of the second feedforward transconductor 616.

Figure 12:
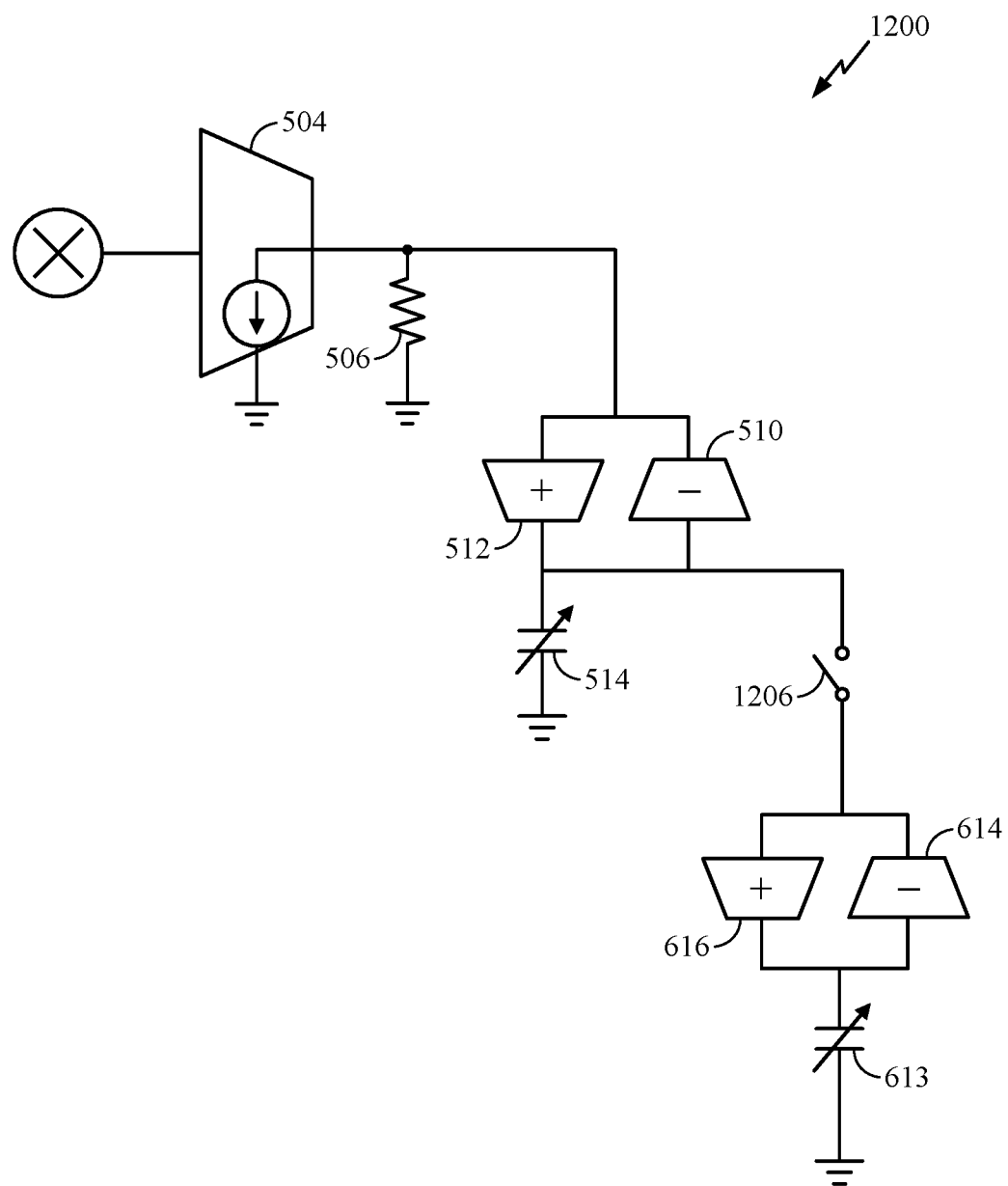
FIG. 12 is a circuit diagram of an example reconfigurable filter circuit, in accordance with certain aspects of the present disclosure.

As described in more detail below, FIG. 12 shows a filter circuit 1200 that is substantially similar to the circuit shown in FIG. 6, but differs in that it also includes a switch 1206 to provide reconfiguration capabilities. For example, if switch 1206 is open, then the circuit 1200 has a configuration similar to that of FIG. 5 and may therefore provide the frequency response 502. Alternatively, if switch 1206 is closed, then both gyrator circuits are selected, and the circuit 1200 has a configuration similar to that of FIG. 6, and may therefore provide the frequency response 602.

Figure 7:
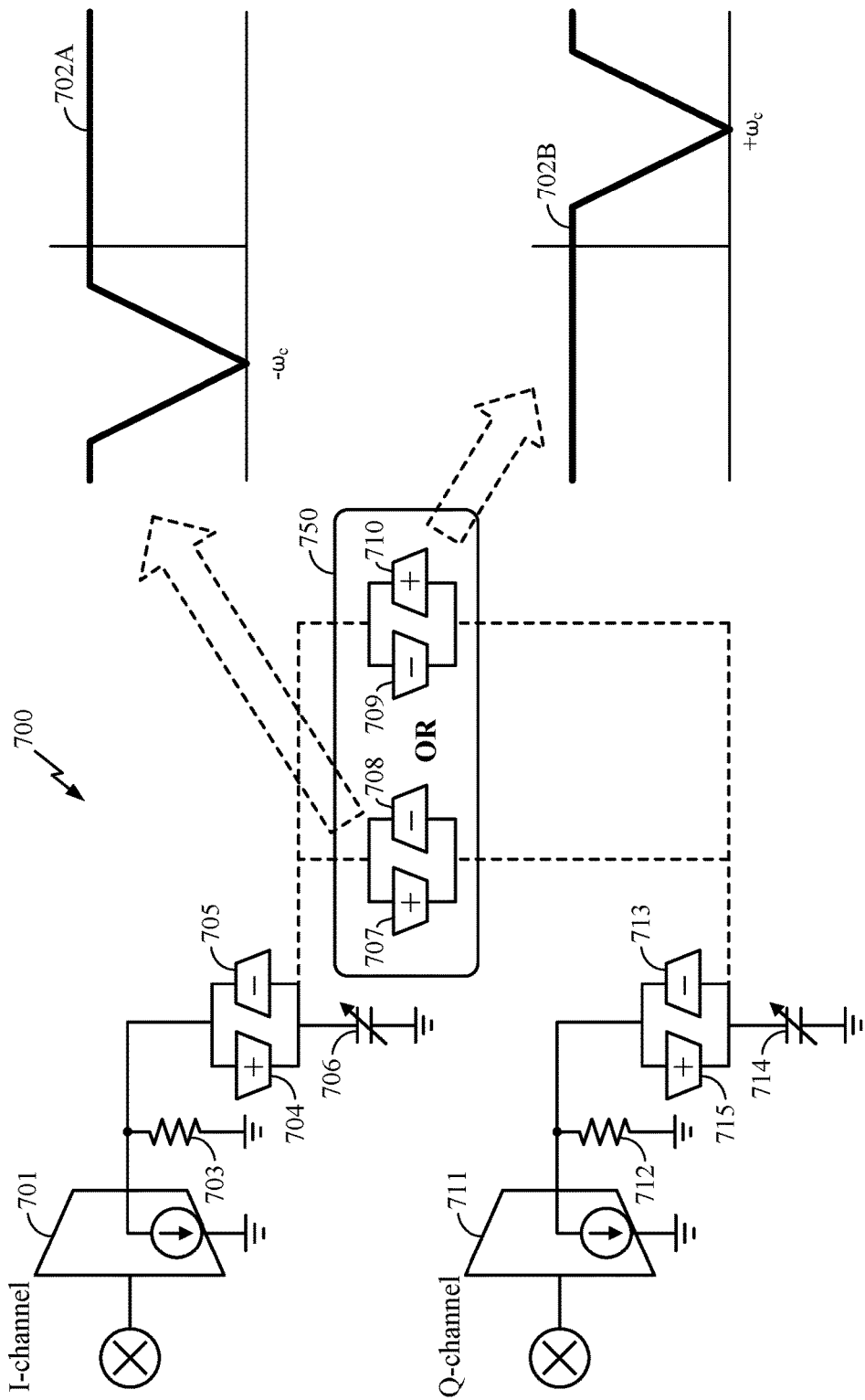
FIG. 7 is a circuit diagram of an example filter circuit and example frequency responses of the filter circuit showing a single notch that can be shifted, in accordance with certain aspects of the present disclosure.

FIG. 7 is a circuit diagram of an example filter circuit 700 and example frequency responses 702A and 702B of the filter circuit 700, in accordance with certain aspects of the present disclosure. The filter circuit 700 includes an in-phase (I) channel and a quadrature (Q) channel coupled together by a filter circuit 750 (e.g., a polyphase filter as shown in FIG. 7). Particularly, the I channel of the filter circuit 700 includes a first gm-C filter (including transconductor 701) connected to a first load resistive element 703 and a first load impedance in the form of one or more gyrator circuits as shown. A first gyrator circuit connected to the I channel may include a feedforward transconductor 704, a feedback transconductor 705, and a capacitive element 706 (similar to the feedforward transconductor 512, the feedback transconductor 510, and the capacitive element 514 described above). The Q channel of the filter circuit 700 also includes a second gm-C filter (including transconductor 711) connected to a second load resistive element 712 and a second load impedance in the form of the one or more gyrator circuits. A second gyrator circuit connected to the Q channel includes a second feedforward transconductor 715, a second feedback transconductor 713, and a capacitive element 714 (also similar to the feedforward transconductor 512, the feedback transconductor 510, and the capacitive element 514 described above). Further, the filter circuit 750 may be coupled between the first and second gyrator circuits. Transconductors 701 and 711 may be analogous to transconductor 504 as described herein.

To implement a polyphase filter, the filter circuit 750 may include a dual gyrator circuit element that includes either transconductors 707 and 708 or transconductors 709 and 710. Transconductor 707 (or 710) is a feedforward transconductor (a non-inverting transconductor), whereas transconductor 708 (or 709) is a feedback transconductor (an inverting transconductor). Depending on which of the transconductor combinations is selected and the I-Q polarity, different asymmetric frequency responses 702A and 702B corresponding to transconductors 707/708 and transconductors 709/710, respectively, may be provided as illustrated in FIG. 7. For example, the transconductors 707/708 may provide a negative notch frequency ($-\Omega_c$), while the transconductors 709/710 may provide a positive notch frequency ($+\omega_c$). This difference in behavior is due to the arrangement of transconductors 707/708 being inverted (i.e., having a reverse orientation) with respect to the transconductors 709/710. The position of the low-frequency notch is shifted to $+/-\omega_c$ depending on I-Q polarity, such that an effective shunt inductance appears only at positive or negative frequencies. For example, for one transconductor combination (e.g., transconductors 709/710), the shift to $+/-\omega_c$ depends on whether I leads Q or if I lags Q by 90°. In this manner, filter circuit 700 provides a positive or negative frequency single notch via I-Q polyphase filtering.

Figure 8:
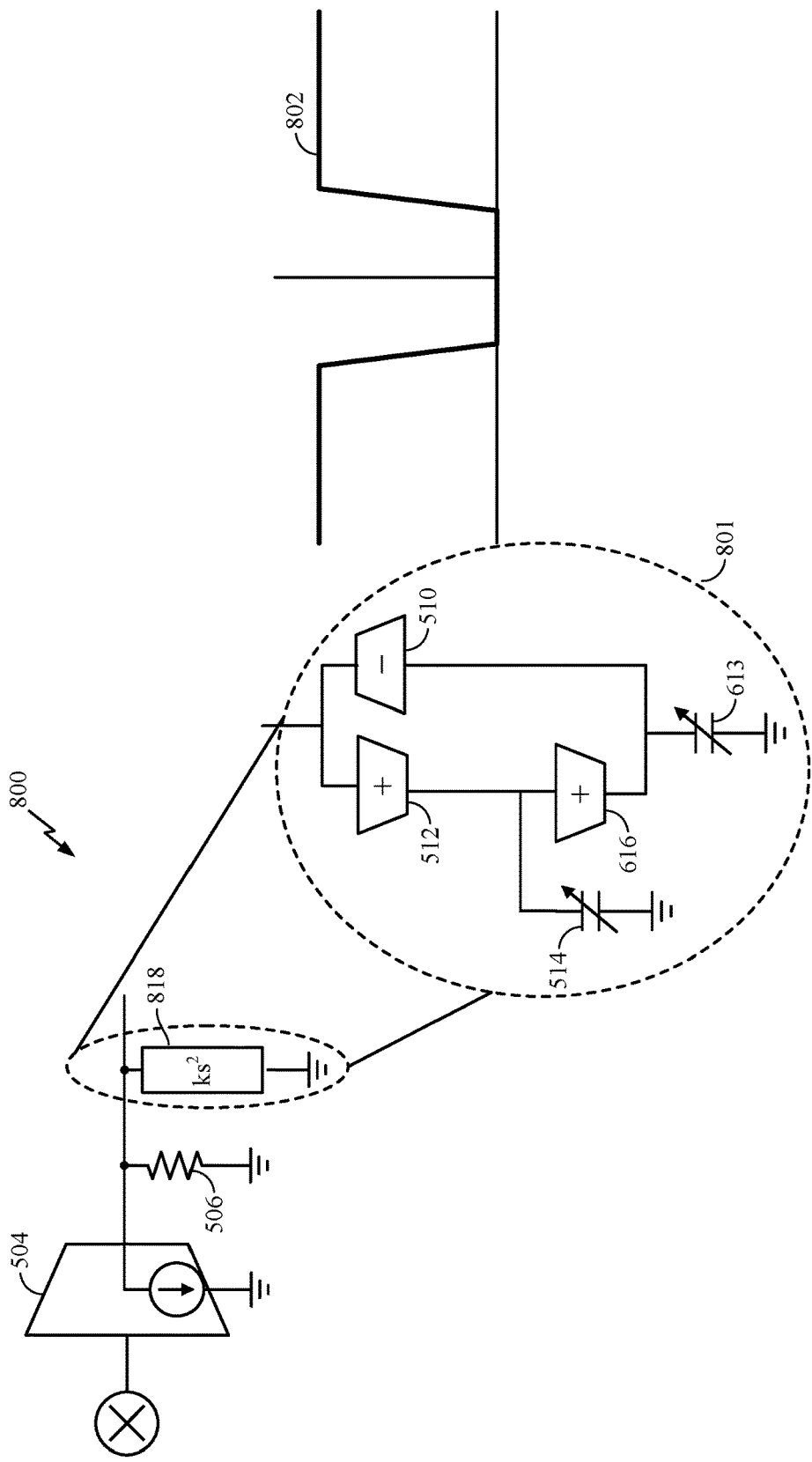
FIG. 8 is a circuit diagram of an example filter circuit and an example second-order single notch frequency response of the circuit, in accordance with certain aspects of the present disclosure.

FIG. 8 is a circuit diagram of an example filter circuit 800 and example frequency response 802, in accordance with certain aspects of the present disclosure. The filter circuit 800 may include a gm-C filter (including transconductor 504) connected with a load impedance implemented by a resistive element 506 connected in parallel with a second-order gyrator circuit 801. The second-order gyrator circuit 801 may be implemented with two feedforward transconductors 512 and 616 connected in series, which may each be followed by a capacitive element 514 and 613, respectively. The output of a feedback transconductor 510 may be connected with the input of the feedforward transconductor 512, and the input of the feedback transconductor 510 may be connected with the output of the feedforward transconductor 616. With the addition of a series transconductor and capacitive element (compared with the gyrator circuit 508 in FIG. 5), the gyrator circuit 801 may provide a second-order low-frequency notch filter with increased rejection, as illustrated by the frequency response 802 in FIG. 8. Thus, the gyrator circuit 801 in FIG. 8 is a "super-inductor" with frequency response ~$ks^2$ ($2^{nd}$-order) that has better selectivity than a first-order, single DC notch described above with respect to FIG. 5 (e.g., less droop and improved rejection). For certain aspects, additional hardware may be added (e.g., the I-Q polyphase filter in FIG. 7) in an effort to shift the notch frequency in the frequency response 802 from DC to $+/-\omega_c$.

Figure 9:
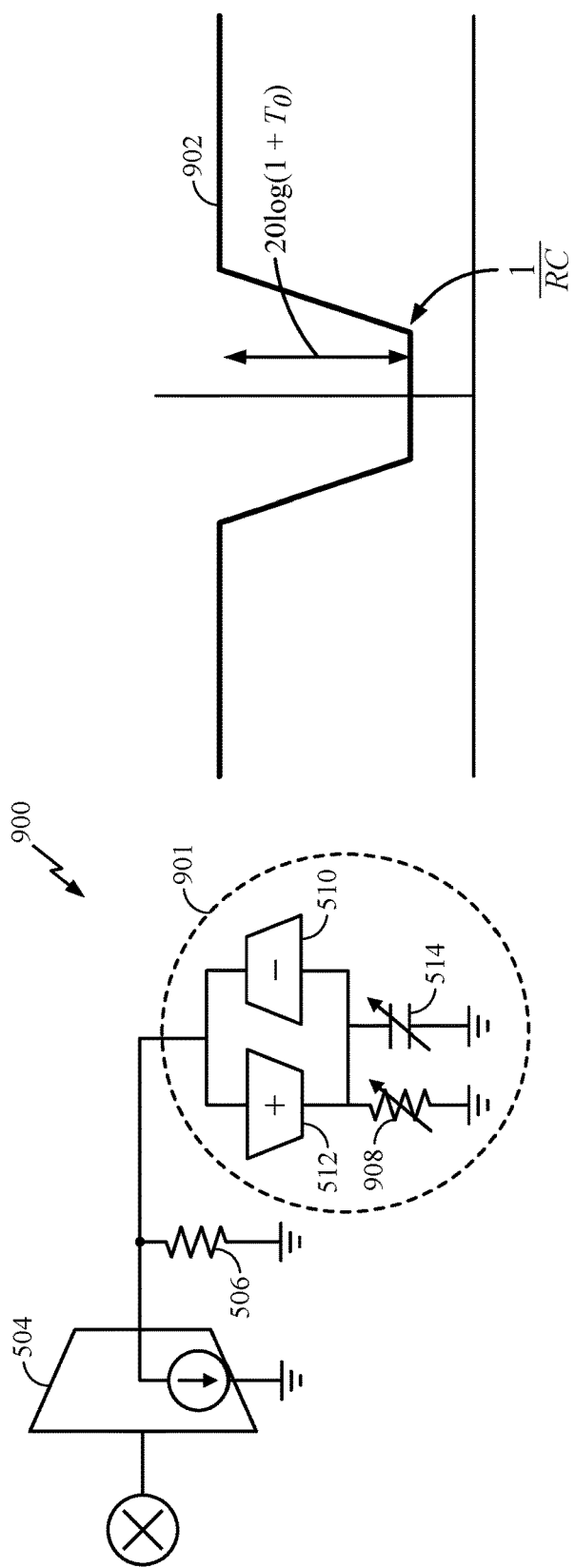
FIG. 9 is a circuit diagram of an example filter circuit and an example single notch frequency response signal of the filter circuit with an adjustable notch depth, in accordance with certain aspects of the present disclosure.

FIG. 9 is a circuit diagram of an example filter circuit 900 and an example frequency response 902 of the filter circuit 900, in accordance with certain aspects of the present disclosure. The filter circuit 900 may include a gm-C filter (including transconductor 504) connected to a load impedance implemented by a resistive element 506 connected in parallel with a gyrator circuit 901. The gyrator circuit 901 may include a feedforward transconductor 512, a feedback transconductor 510, and a capacitive element 514. The gyrator circuit 901 may further include a resistive element 908, which may be connected in parallel with the capacitive element 514. The resistive element 908 may be tunable (as shown) or fixed.

As shown in the frequency response 902, the resistive element 908 (whether parasitic or deliberate) may help control notch depth and bandwidth of the notch at DC. Namely, the corner frequency of the notch floor may be controlled by the resistance-capacitance (RC) time constant of the gyrator circuit, where R is the resistance of the resistive element 908 and C is the capacitance of the capacitive element 514. Further, the notch depth may be controlled by the loop gain.

Figure 10:
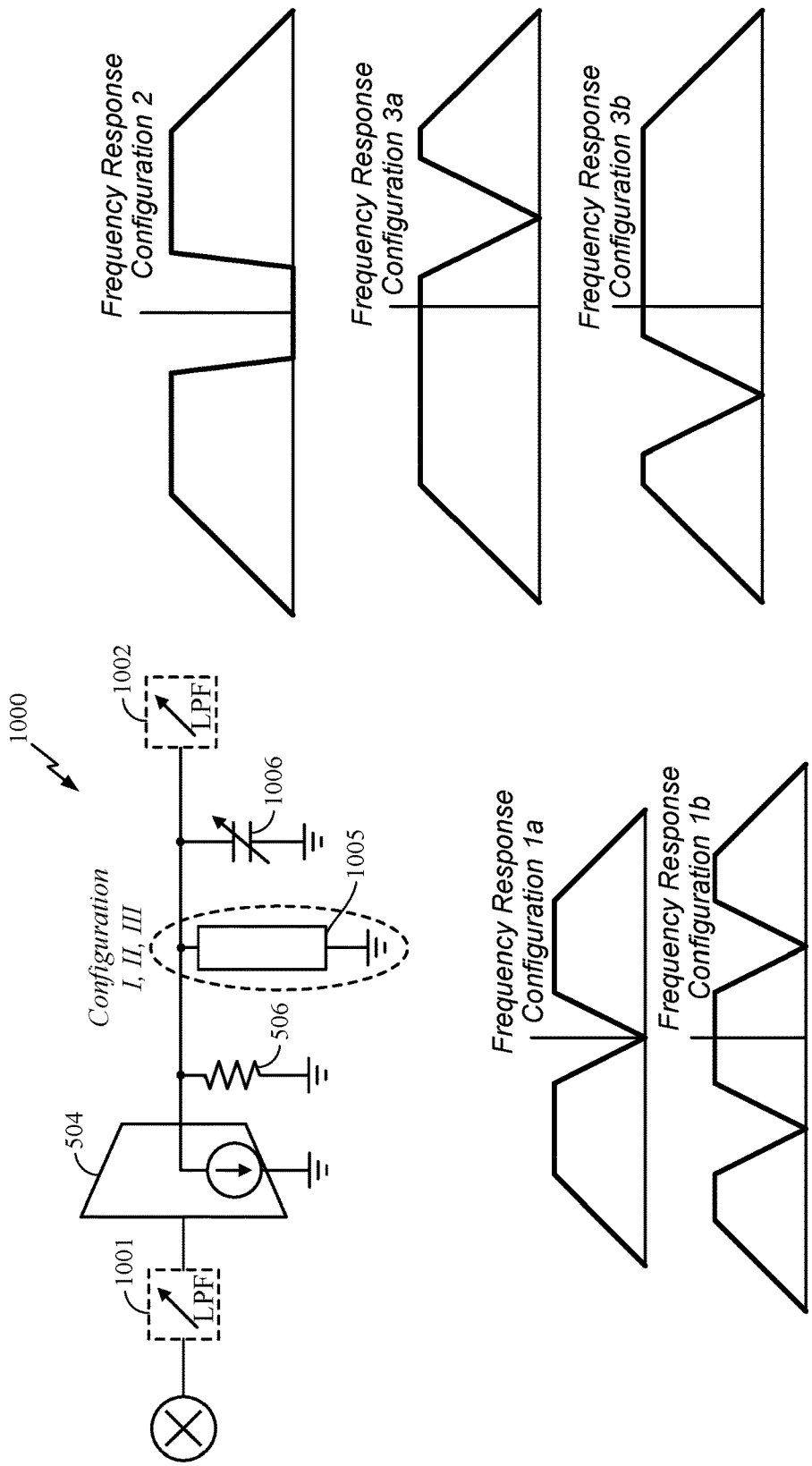
FIG. 10 is a circuit diagram of an example reconfigurable filter circuit and example frequency responses for different configuration of the filter circuit, in accordance with certain aspects of the present disclosure.

FIG. 10 is a circuit diagram of an example filter circuit 1000 and various example frequency responses of the filter circuit 1000, in accordance with certain aspects of the present disclosure. Particularly, the filter circuit 1000 may include an optional initial low-pass filter (LPF) 1001 and/or another optional LPF 1002. Additionally, a gm-C filter (including transconductor 504) and a load impedance may be connected therebetween. The load impedance may comprise a resistive element 506, a shunt impedance 1005, and an optional capacitive element 1006 connected in parallel. For certain aspects, the transconductor 504 and the capacitive element 1006 at the output of the transconductor 504 may compose the gm-C filter (e.g., with a voltage input to the gm-C filter). For other aspects, the transconductor 504 and a capacitive element at the input of the transconductor 504 (e.g., a capacitive element in the LPF 1001) may compose the gm-C filter (e.g., with a current input to the gm-C filter, where the transconductor 504 may be implemented with a common-gate or common-base device). The shunt impedance 1005 may be implemented using a number of different configurations (1a, 1b, 2, 3a, and/or 3b). For example, some configuration options that may be selected include those shown in FIG. 5 (configuration 1a), FIG. 6 (configuration 1b), FIG. 7 (configurations 3a and 3b), and FIG. 8 (configuration 2). The addition of the capacitive element 1006 and/or at least one of the low-pass filters 1001, 1002 preceding and/or after the transconductor 504 as shown can provide a roll-off at higher frequencies (both positive and negative) and create a number of different frequency responses as illustrated in FIG. 10. For example, a first set of configurations 1a and 1b may be implemented using the circuit of FIG. 10 in combination with at least a portion of the circuit of either FIG. 5 or FIG. 6 to provide either a dual bandpass response centered at DC (configuration 1a) or a multi-bandpass response (configuration 1b) as shown in FIG. 10, respectively. In other words, the addition of the capacitive element 1006 and/or at least one of the low-pass filters 1001, 1002 preceding and/or after the transconductor 504 in FIG. 5 or 6 may alter the frequency response 502 or 602 at higher frequencies to generate the dual bandpass response (configuration 1a) or the multi-bandpass response (configuration 1b), respectively. Further, configuration 2 may be implemented using the circuit of FIG. 10 and a portion of the circuit of FIG. 8 to provide a higher-order (sharp roll-off) bandpass response as shown. Another set of configurations (3a and 3b) may be implemented using the circuit of FIG. 10 and a portion of the circuit of FIG. 7 to provide an asymmetric +/− bandpass response.

Figure 11:
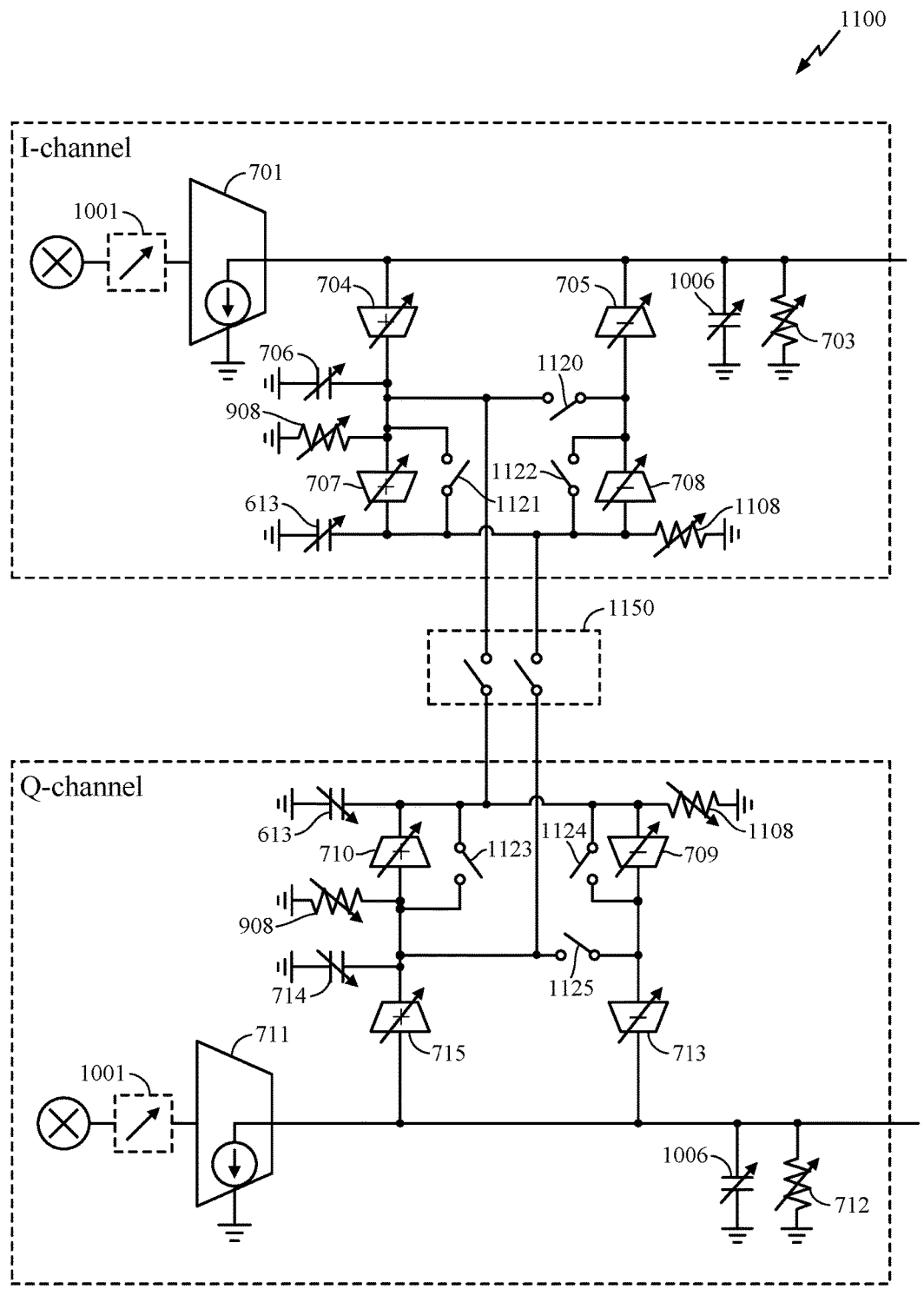
FIG. 11 is a circuit diagram of an example reconfigurable filter circuit having an in-phase (I) channel and a quadrature (Q) channel, in accordance with certain aspects of the present disclosure.

FIG. 11 is a circuit diagram of an example programmable filter circuit 1100 having an I channel and a Q channel, in accordance with certain aspects of the present disclosure. As shown, the circuit 1100 may reuse some of the same circuitry as described above, but with the addition of multiple switches for reconfigurability of the filter circuit. In this manner, the circuit 1100 can be programmed to provide any of various frequency responses. These frequency responses may allow a single receiver circuit to concurrently receive two NCCA bands (2-NCCA), three NCAA bands (3-NCCA), and more than three NCCA bands with additional replicas. For example, additional notches may be added by adding corresponding circuitry as shown in one of FIGS. 5-10 that is configured to provide the desired notch filter. Further, the circuit 1100 may be tunable across frequency and bandwidth (BW) because of the tunable and selectable components of the circuit. As depicted in FIG. 11, the resistive, capacitive, and/or transconductive elements may be individually tunable for certain aspects. In the case of a tunable transconductive element, one or more of the individual resistive and/or capacitive elements composing the transconductive element may be tunable, such that the transconductive element is effectively tunable.

Another feature provided by this circuit 1100 includes an ability to disable and/or bypass the transconductance (gm) cells (e.g., the transconductors 704, 705, 707-710, 713, and 715) using one or more switches, such that their exclusion is transparent to the circuit (e.g., seeing only a LPF response, due to the capacitive elements 1006 and/or the optional low-pass filters 1001). For example, as shown, the circuit 1100 includes switches 1120, 1121, and 1122 in the I-channel portion of the circuit and switches 1123, 1124, and 1125 in the Q-channel portion of the circuit 1100. To bypass transconductor 707, for example, switch 1121 may be closed, and switch 1122 may be closed to bypass transconductor 708. The circuit 1100 also includes switches in the switch network 1150 between the I channel and the Q channel, which may be used to couple the I and Q channels together to implement the filter circuit 750 of FIG. 7, for example. These switches can be used to disable certain portions of the circuit such that the end results may leave a circuit arrangement that is somewhat similar to any one of the above described arrangements of FIGS. 5-10, thereby providing a similar frequency response. Further, other combinations of disabled/enabled circuit elements may provide other frequency responses, especially when combined with the ability of one or more of the circuit elements to be tunable and/or removable. The switches may be controlled by a controller (e.g., controller 230 or 280), which may be located in a modem module, for example. FIG. 11 may also include one or more resistive elements 1108, which may be fixed or variable. These resistive elements may be connected in parallel with (or replace) the capacitive elements 613 as shown.

Figure 13:
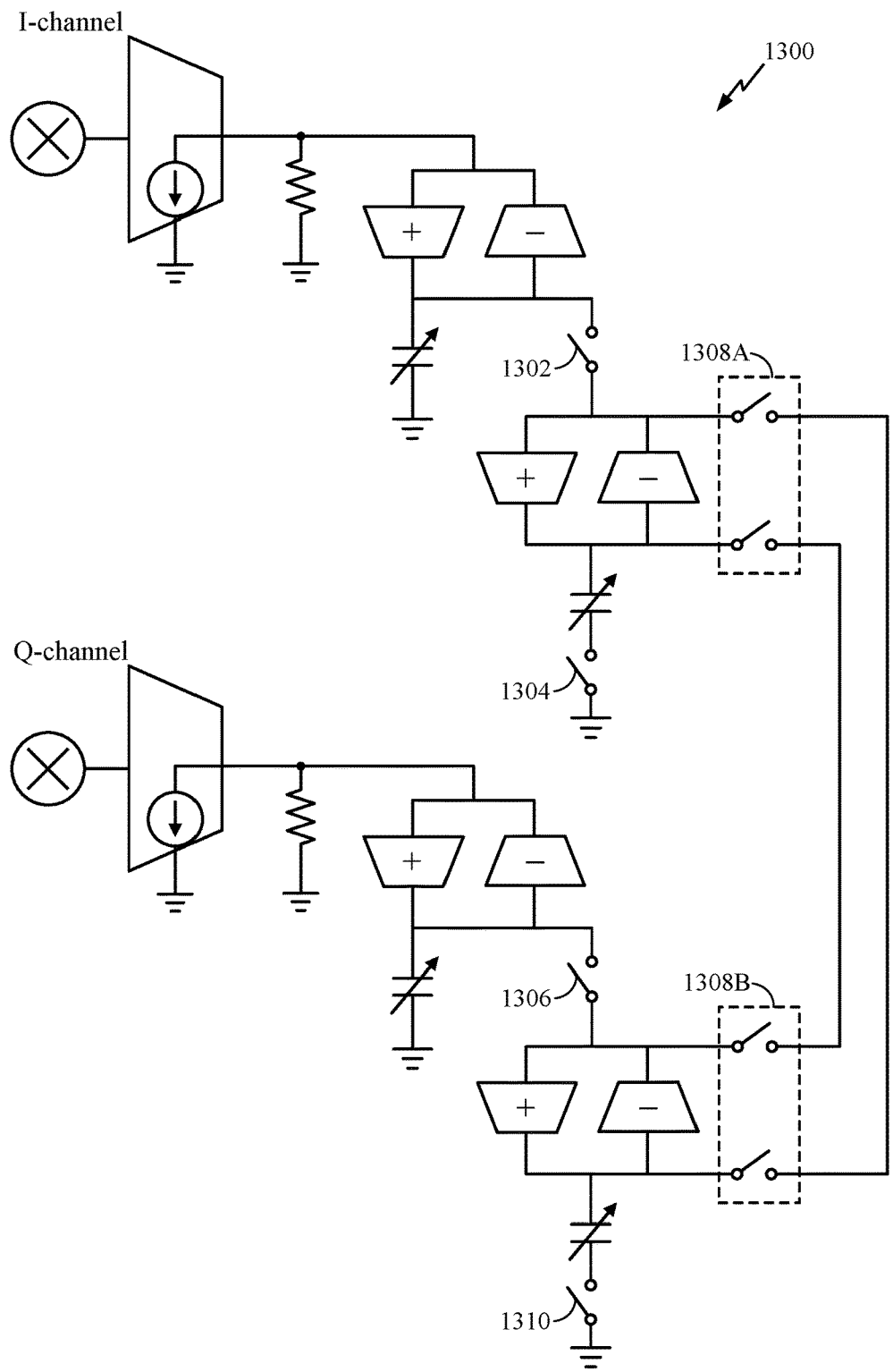
FIG. 13 is a circuit diagram of an example reconfigurable filter circuit having an I channel and a Q channel, in accordance with certain aspects of the present disclosure.

FIG. 13 is a circuit diagram of a reconfigurable filter circuit 1300 having an I-channel and a Q-channel, in accordance with certain aspects of the present disclosure. The reconfigurable filter circuit 1300 of FIG. 13 is a simplified version of the filter circuit 1100 of FIG. 11, but may have less configurability. The filter circuit 1300 may be configured to provide various configurations by toggling the switches 1302, 1304, 1306, 1308A, 1308B, and/or 1310 to offer the frequency responses described above.

For example, if switches 1302 and 1304 are closed and switches 1308A are open, then the I-channel portion has a configuration similar to that of the filter circuit 600 in FIG. 6. Therefore, the I-channel portion may provide a frequency response similar to frequency response 602. Alternatively, if switches 1302, 1304, and 1308A are open, then a portion of the circuit is disabled, leaving the remaining portion of the circuit to filter an incoming signal. The remaining portion of the circuit 1300 has a configuration similar to that of FIG. 5 and may therefore provide a frequency response similar to frequency response 502. Similarly, if switches 1306 and 1310 are closed and switches 1308B are open, then the Q-channel portion has a configuration similar to that of the filter circuit 600 in FIG. 6 and may therefore generate a frequency response similar to frequency response 602. Alternatively, if switches 1306, 1310, and 1308B are open, then a portion of the circuit 1300 is disabled, and the remaining portion of the circuit 1300 has a configuration similar to that of FIG. 5 and may therefore provide a response like frequency response 502.

Additional frequency responses may also be generated by using different combinations of the switches 1302, 1304, 1306, and 1310 in addition to also using switches 1308A and 1308B. For example, if switches 1302, 1306, 1308A, and 1308B are closed and switches 1304 and 1310 are open, then the filter circuit 1300 has a configuration similar to the filter circuit 700 in FIG. 7 and may generate a frequency response similar to frequency response 702A or 702B, depending on the I-Q polarity, as described above. In another aspect (not shown), a single set of similar switches to those of 1308A and 1308B may be provided, rather than providing redundant sets of switches at either end as is currently shown. Although not shown, the filter circuit 1300 may also include the LPF 1001, the LPF 1002, and/or the capacitive element 1006 in either or both I and Q channels.

Figure 14:
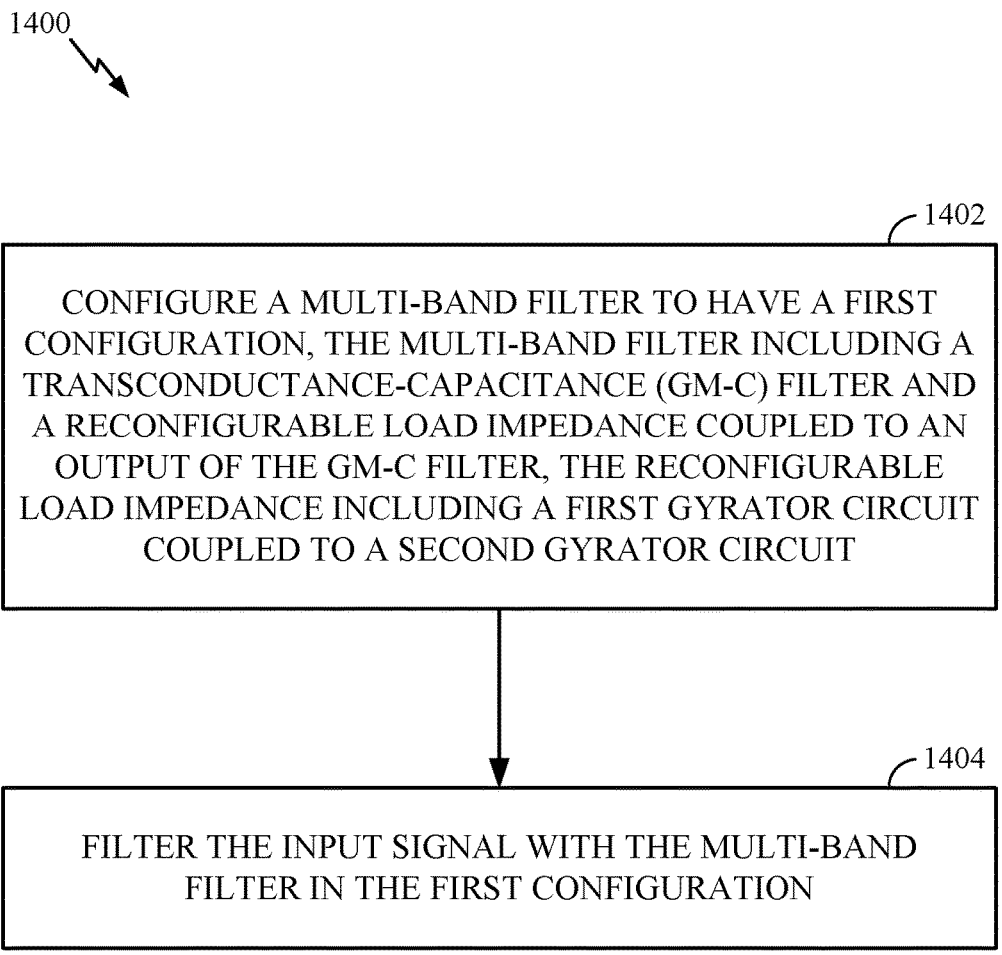
FIG. 14 is a flow diagram illustrating example operations for processing an input signal using a multi-band filter, in accordance with certain aspects of the present disclosure.

FIG. 14 is a flow diagram of example operations 1400 for processing an input signal using a filter, in accordance with certain aspects of the present disclosure. The operations 1400 may be performed by a multi-band filter (e.g., the filter circuits of FIGS. 5-13) and a control circuit (e.g., controller 230 or 280) for controlling configuration of the filter.

The operations 1400 may begin, at block 1402, by configuring a multi-band filter to have a first configuration. The multi-band filter generally includes a transconductance-capacitance (gm-C) filter (e.g., gm-C filter including transconductor 504) and a reconfigurable load impedance coupled to an output of the gm-C filter, the reconfigurable load impedance including a first gyrator circuit (e.g., gyrator circuit 508) coupled to a second gyrator circuit. At block 1404, the input signal may be filtered by the multi-band filter in the first configuration.

According to certain aspects, the operations 1400 further involve configuring the multi-band filter to have a second configuration, different from the first configuration, and filtering the input signal with the multi-band filter in the second configuration. For certain aspects, the first gyrator circuit is coupled to the second gyrator circuit via a switch (e.g., switch 1206). In this case, configuring the multi-band filter to have the first configuration may entail setting the switch to have a first position, and configuring the multi-band filter to have the second configuration may involve setting the switch to have a second position. For certain aspects, the multi-band filter is configured as a high-pass filter when the switch is open and as a notch filter when the switch is closed. For certain aspects, the first gyrator circuit includes a first feedforward transconductor (e.g., feedforward transconductor 512 or 704) having an input coupled to the output of the gm-C filter and an output coupled to one terminal of a first switch (e.g., switch 1120); the first gyrator circuit further includes a first feedback transconductor (e.g., feedback transconductor 510 or 705) having an input coupled to another terminal of the first switch and an output coupled to the output of the gm-C filter; the second gyrator circuit comprises a second feedforward transconductor (e.g., feedforward transconductor 616 or 707) having an input coupled to the output of the first feedforward transconductor, and the second gyrator circuit further includes a second feedback transconductor (e.g., feedback transconductor 614 or 708) having an input coupled to an output of the second feedforward transconductor and an output coupled to the input of the first feedback transconductor. In this case, configuring the multi-band filter to have the first configuration may involve setting the first switch to have a first position, and configuring the multi-band filter to have the second configuration may entail setting the first switch to have a second position. For certain aspects, the multi-band filter further includes a second switch (e.g., switch 1121) coupled in parallel with the second feedforward transconductor and a third switch (e.g., switch 1122) coupled in parallel with the second feedback transconductor. In this case, configuring the multi-band filter to have the first configuration may involve setting at least one of the second switch or the third switch to have a first position, and configuring the multi-band filter to have the second configuration may entail setting the at least one of the second switch or the third switch to have a second position. For certain aspects, the multi-band filter further includes a capacitive element (e.g., capacitive element 706) coupled to the output of the first feedforward transconductor or the input of the first feedback transconductor. The capacitive element may be a variable capacitive element or a fixed capacitive element. For certain aspects, the multi-band filter further includes a resistive element (e.g., resistive element 908) coupled in parallel with the capacitive element. For certain aspects, the multi-band filter further includes at least one of a capacitive element (e.g., capacitive element 613) or a resistive element (e.g., resistive element 1108) coupled to the output of the second feedforward transconductor and to the input of the second feedback transconductor.

According to certain aspects, at least one of the first gyrator circuit or the second gyrator circuit comprises a feedforward transconductor (e.g., feedforward transconductor 512, 616, 704, or 707) and a feedback transconductor (e.g., feedback transconductor 510, 614, 705, or 708) coupled in parallel with the feedforward transconductor. For certain aspects, the at least one of the first gyrator circuit or the second gyrator circuit further includes a capacitive element (e.g., capacitive element 514 or 613) coupled to at least one of an output of the feedforward transconductor or an input of the feedback transconductor. The capacitive element may be a variable capacitive element or a fixed capacitive element. For certain aspects, the multi-band filter further includes a resistive element (e.g., resistive element 908 or 1108) coupled in parallel with the capacitive element.

According to certain aspects, the multi-band filter further includes at least one of a shunt capacitive element (e.g., capacitive element 1006) or a low-pass filter (e.g., LPF 1002). The shunt capacitive element and/or the low-pass filter may be coupled to the reconfigurable load impedance.

According to certain aspects, the multi-band filter further includes a resistive element (e.g., resistive element 506 or 703) coupled in parallel with the reconfigurable load impedance.

According to certain aspects, the multi-band filter further includes a low-pass filter (e.g., LPF 1001) coupled to an input of the gm-C filter.

Figure 15:
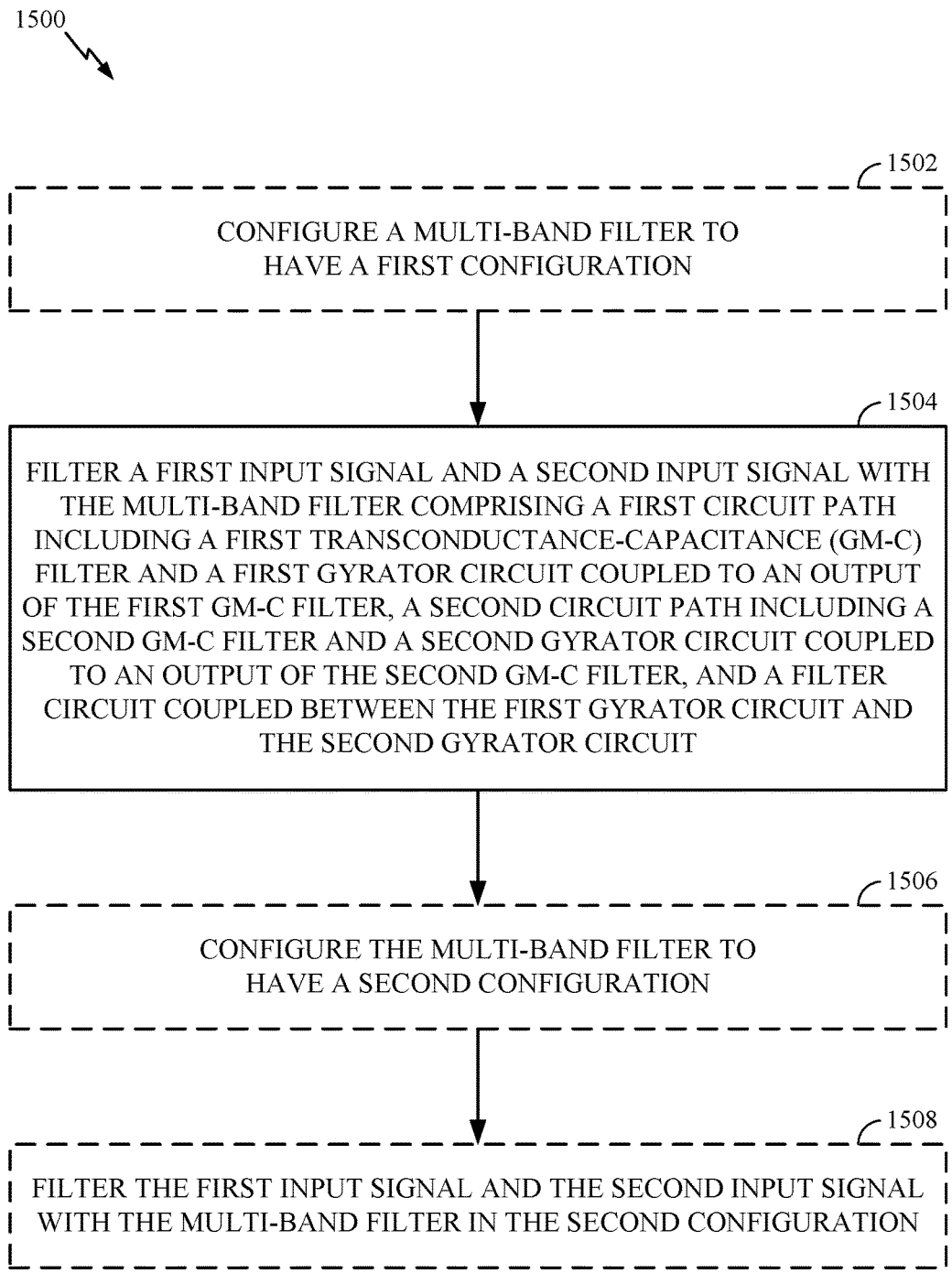
FIG. 15 is a flow diagram illustrating example operations for processing a first input signal and a second input signal using a multi-band filter, in accordance with certain aspects of the present disclosure.

FIG. 15 is a flow diagram of example operations 1500 for processing a first input signal and a second input signal, in accordance with certain aspects of the present disclosure. The operations 1500 may be performed by a multi-band filter (e.g., the filter circuits of FIGS. 5-13) and a control circuit (e.g., controller 230 or 280) for controlling configuration of the filter.

The operations 1500 may involve the multi-band filter filtering the first input signal and the second input signal at block 1504. The multi-band filter may include: (1) a first circuit path including a first transconductance-capacitance (gm-C) filter (e.g., the gm-C filter including transconductor 701) and a first gyrator circuit coupled to an output of the first gm-C filter; (2) a second circuit path including a second gm-C filter (e.g., the gm-C filter including transconductor 711) and a second gyrator circuit coupled to an output of the second gm-C filter; and (3) a filter circuit (e.g., a polyphase filter implemented by filter circuit 750) coupled between the first gyrator circuit and the second gyrator circuit.

According to certain aspects, at least one of the first gyrator circuit or the second gyrator circuit comprises a feedforward transconductor (e.g., feedforward transconductor 704 or 715) and a feedback transconductor (e.g., feedback transconductor 705 or 713) coupled in parallel with the feedforward transconductor. In this case, the at least one of the first gyrator circuit or the second gyrator circuit may further include a capacitive element (e.g., capacitive element 706 or 714) coupled to at least one of an output of the feedforward transconductor or an input of the feedback transconductor.

According to certain aspects, the filter circuit includes a feedforward transconductor (e.g., feedforward transconductor 707 or 710) and a feedback transconductor (e.g., feedback transconductor 708 or 709) coupled in parallel with the feedforward transconductor. For certain aspects, the first gyrator circuit may be coupled to an input of the feedforward transconductor of the filter circuit, and the second gyrator circuit may be coupled to an output of the feedforward transconductor of the filter circuit. For other aspects, the first gyrator circuit may be coupled to an input of the feedback transconductor of the filter circuit, and the second gyrator circuit may be coupled to an output of the feedback transconductor of the filter circuit.

According to certain aspects, the first circuit path comprises an in-phase (I) channel, and the second circuit path comprises a quadrature (Q) channel.

According to certain aspects, the filter circuit includes a polyphase filter circuit.

According to certain aspects, the operations 1500 further involve configuring the multi-band filter to have a first configuration at optional block 1502. In this case, the filtering at block 1504 may entail filtering the first input signal and the second input signal with the multi-band filter in the first configuration. For certain aspects, the operations 1500 may further include configuring the multi-band filter to have a second configuration, different from the first configuration, at optional block 1506. In this case, the operations 1500 may further entail filtering the first input signal and the second input signal with the multi-band filter in the second configuration at optional block 1508. For certain aspects, the first gyrator circuit includes a first switch (e.g., switch 1120); a first feedforward transconductor (e.g., feedforward transconductor 704) having an input coupled to the output of the first gm-C filter and an output coupled to one terminal of the first switch; a first feedback transconductor (e.g., feedback transconductor 705) having an input coupled to another terminal of the first switch and an output coupled to the output of the first gm-C filter; a second feedforward transconductor (e.g., feedforward transconductor 707) having an input coupled to the output of the first feedforward transconductor; and a second feedback transconductor (e.g., feedback transconductor 708) having an input coupled to an output of the second feedforward transconductor and an output coupled to the input of the first feedback transconductor. In this case, configuring the multi-band filter to have the first configuration at optional block 1502 may involve setting the first switch to have a first position, and configuring the multi-band filter to have the second configuration at optional block 1506 may entail setting the first switch to have a second position. For certain aspects, the first gyrator circuit further includes a second switch (e.g., switch 1121) coupled in parallel with the second feedforward transconductor and a third switch (e.g., switch 1122) coupled in parallel with the second feedback transconductor. In this case, configuring the multi-band filter to have the first configuration at optional block 1502 may involve setting at least one of the second switch or the third switch to have a first position, and configuring the multi-band filter to have the second configuration at optional block 1506 may entail setting the at least one of the second switch or the third switch to have a second position. For certain aspects, the first gyrator circuit further includes a capacitive element (e.g., capacitive element 706) coupled to the output of the first feedforward transconductor or the input of the first feedback transconductor. In this case, the first gyrator circuit may further include a resistive element (e.g., resistive element 908) coupled in parallel with the capacitive element. For certain aspects, the first gyrator circuit further includes at least one of a capacitive element (e.g., capacitive element 613) or a resistive element (e.g., resistive element 1108) coupled to the output of the second feedforward transconductor and to the input of the second feedback transconductor.

According to certain aspects, at least one of the first circuit path or the second circuit path further includes at least one of a shunt capacitive element (e.g., capacitive element 1006) or a low-pass filter (e.g., LPF 1002). The shunt capacitive element and/or the low-pass filter may be coupled to at least one of the first gyrator circuit or the second gyrator circuit.

According to certain aspects, at least one of the first circuit path or the second circuit path further includes a shunt resistive element (e.g., resistive element 703 or 712). The shunt resistive element may be coupled to at least one of the first gyrator circuit or the second gyrator circuit.

According to certain aspects, at least one of the first circuit path or the second circuit path further includes a low-pass filter (e.g., LPF 1001). The low-pass filter may be coupled to at least one of an input of the first gm-C filter or an input of the second gm-C filter.

According to certain aspects, at least one of the first gyrator circuit or the second gyrator circuit is reconfigurable to present different impedances.

Certain aspects of the present disclosure provide a multi-band filter. The multi-band filter generally includes a gm-C filter and a reconfigurable load impedance coupled to an output of the gm-C filter, the reconfigurable load impedance comprising a first gyrator circuit coupled to a second gyrator circuit.

According to certain aspects, at least one of the first gyrator circuit or the second gyrator circuit includes a feedforward transconductor and a feedback transconductor coupled in parallel with the feedforward transconductor. For certain aspects, the at least one of the first gyrator circuit or the second gyrator circuit further includes a capacitive element coupled to at least one of an output of the feedforward transconductor or an input of the feedback transconductor. The capacitive element may include a variable capacitive element or a fixed capacitive element. For certain aspects, the multi-band filter further includes a resistive element coupled in parallel with the capacitive element.

According to certain aspects, the multi-band filter further includes a first switch. In this case, the first gyrator circuit may include a first feedforward transconductor having an input coupled to the output of the gm-C filter and an output coupled to one terminal of the first switch; the first gyrator circuit may further include a first feedback transconductor having an input coupled to another terminal of the first switch and an output coupled to the output of the gm-C filter; the second gyrator circuit may include a second feedforward transconductor having an input coupled to the output of the first feedforward transconductor; and the second gyrator circuit may further include a second feedback transconductor having an input coupled to an output of the second feedforward transconductor and an output coupled to the input of the first feedback transconductor. For certain aspects, the multi-band filter further includes a second switch coupled in parallel with the second feedforward transconductor and a third switch coupled in parallel with the second feedback transconductor. For certain aspects, the multi-band filter further includes a capacitive element coupled to the output of the first feedforward transconductor or the input of the first feedback transconductor. The capacitive element may include a fixed capacitive element or a variable capacitive element. For certain aspects, the multi-band filter further includes a resistive element coupled in parallel with the capacitive element. For certain aspects, the multi-band filter further includes at least one of a capacitive element or a resistive element coupled to the output of the second feedforward transconductor and to the input of the second feedback transconductor.

According to certain aspects, the first gyrator circuit is coupled to the second gyrator circuit via a switch. For certain aspects, the multi-band filter may be configured as a high-pass filter when the switch is open and as a notch filter when the switch is closed.

According to certain aspects, the multi-band filter further includes at least one of a shunt capacitive element or a low-pass filter, coupled to the reconfigurable load impedance.

According to certain aspects, the multi-band filter further includes a resistive element coupled in parallel with the reconfigurable load impedance.

According to certain aspects, the multi-band filter further includes multi-band filter further includes a low-pass filter coupled to an input of the gm-C filter.

According to certain aspects, the multi-band filter is capable of being configured to have a frequency response with two or more non-contiguous passbands.

Certain aspects of the present disclosure provide a multi-band filter. The multi-band filter generally includes a first circuit path comprising a first gm-C filter and a first gyrator circuit coupled to an output of the first gm-C filter, a second circuit path comprising a second gm-C filter and a second gyrator circuit coupled to an output of the second gm-C filter, and a filter circuit coupled between the first gyrator circuit and the second gyrator circuit.

According to certain aspects, at least one of the first gyrator circuit or the second gyrator circuit includes a feedforward transconductor and a feedback transconductor coupled in parallel with the feedforward transconductor. For certain aspects, the at least one of the first gyrator circuit or the second gyrator circuit further includes a capacitive element coupled to at least one of an output of the feedforward transconductor or an input of the feedback transconductor. The capacitive element may include a variable capacitive element or a fixed capacitive element.

According to certain aspects, the filter circuit includes a feedforward transconductor and a feedback transconductor coupled in parallel with the feedforward transconductor, the first gyrator circuit is coupled to an input of the feedforward transconductor of the filter circuit, and the second gyrator circuit is coupled to an output of the feedforward transconductor of the filter circuit.

According to certain aspects, the filter circuit includes a feedforward transconductor and a feedback transconductor coupled in parallel with the feedforward transconductor, the first gyrator circuit is coupled to an input of the feedback transconductor of the filter circuit, and the second gyrator circuit is coupled to an output of the feedback transconductor of the filter circuit.

According to certain aspects, the first circuit path comprises an in-phase (I) channel, and the second circuit path comprises a quadrature (Q) channel.

According to certain aspects, the filter circuit includes a polyphase filter circuit.

According to certain aspects, the first gyrator circuit includes a first switch; a first feedforward transconductor having an input coupled to the output of the first gm-C filter and an output coupled to one terminal of the first switch; a first feedback transconductor having an input coupled to another terminal of the first switch and an output coupled to the output of the first gm-C filter; a second feedforward transconductor having an input coupled to the output of the first feedforward transconductor; and a second feedback transconductor having an input coupled to an output of the second feedforward transconductor and an output coupled to the input of the first feedback transconductor. For certain aspects, the multi-band filter further includes a second switch coupled in parallel with the second feedforward transconductor and a third switch coupled in parallel with the second feedback transconductor. For certain aspects, the multi-band filter further includes a capacitive element coupled to the output of the first feedforward transconductor or the input of the first feedback transconductor. The capacitive element may include a variable capacitive element or a fixed capacitive element. For certain aspects, the multi-band filter further includes a resistive element coupled in parallel with the capacitive element. For certain aspects, the multi-band filter further includes at least one of a capacitive element or a resistive element coupled to the output of the second feedforward transconductor and to the input of the second feedback transconductor. For certain aspects, the multi-band filter further includes a second switch having one terminal coupled to the output of the first feedforward transconductor or to the input of the first feedback transconductor and another terminal coupled to the filter circuit.

According to certain aspects, at least one of the first circuit path or the second circuit path further includes at least one of a shunt capacitive element or a low-pass filter, coupled to at least one of the first gyrator circuit or the second gyrator circuit.

According to certain aspects, at least one of the first circuit path or the second circuit path further includes a shunt resistive element, coupled to at least one of the first gyrator circuit or the second gyrator circuit.

According to certain aspects, at least one of the first circuit path or the second circuit path further includes a low-pass filter, coupled to at least one of an input of the first gm-C filter or an input of the second gm-C filter.

According to certain aspects, at least one of the first gyrator circuit or the second gyrator circuit is reconfigurable to present different impedances.

According to certain aspects, the multi-band filter is capable of being configured to have a frequency response with a notch frequency offset from DC. For certain aspects, the notch frequency has a positive or negative offset based on a polarity of the first circuit path with respect to the second circuit path.

The architectures described herein provide a leap forward toward software-defined radio architectures. Certain aspects allow single-Rx hardware for multi-band (also referred to as multi-carrier) operation, which should not have the current, area, and performance penalties of the 2-LO approach that includes double the number of synthesizers, LOs, mixers, and receiver baseband filters (RxBBFs). Moreover, certain aspects avoid spurs of the 3-LO approach (and the associated current/area/performance penalty) and can handle three or more chunks of spectrum (unlike previous approaches). Additionally, certain aspects can handle non-symmetrically spaced and different BW carriers and/or may also handle low intermediate frequency (low-IF) or zero intermediate frequency (zero-IF) scenarios. Certain aspects may also keep gain/SNR (signal-to-noise ratio) high by attenuating jammers in adjacent channels. Further, certain aspects may enable high throughput multi-Gb/s for 5G with a fragmented spectrum.

The various operations or methods described above may be performed by any suitable means capable of performing the corresponding functions. The means may include various hardware and/or software component(s) and/or module(s), including, but not limited to one or more circuits. Generally, where there are operations illustrated in figures, those operations may have corresponding counterpart means-plus-function components with similar numbering.

For example, means for transmitting may comprise a transmitter (e.g., the transceiver front-end 254 of the user terminal 120 depicted in FIG. 2 or the transceiver front-end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front-end 254 of the user terminal 120 depicted in FIG. 2 or the transceiver front-end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A multi-band filter comprising:
   a transconductance-capacitance (gm-C) filter; and
   a reconfigurable load impedance coupled to an output of the gm-C filter, the reconfigurable load impedance comprising a first gyrator circuit coupled to a second gyrator circuit, wherein the first gyrator circuit is coupled to the second gyrator circuit via a switch, and wherein the multi-band filter is configured as a high-pass filter when the switch is open and as a notch filter when the switch is closed.

2. The multi-band filter of claim 1, wherein at least one of the first gyrator circuit or the second gyrator circuit comprises a feedforward transconductor and a feedback transconductor coupled in parallel with the feedforward transconductor.

3. The multi-band filter of claim 2, wherein the at least one of the first gyrator circuit or the second gyrator circuit further comprises a capacitive element coupled to at least one of an output of the feedforward transconductor or an input of the feedback transconductor.

4. The multi-band filter of claim 3, further comprising a resistive element coupled in parallel with the capacitive element.

5. The multi-band filter of claim 1, further comprising at least one of a shunt capacitive element or a low-pass filter, coupled to the reconfigurable load impedance.

6. The multi-band filter of claim 1, further comprising a resistive element coupled in parallel with the reconfigurable load impedance.

7. The multi-band filter of claim 1, further comprising a low-pass filter coupled to an input of the gm-C filter.

8. A multi-band filter comprising:
   a transconductance-capacitance (gm-C) filter;
   a reconfigurable load impedance coupled to an output of the gm-C filter, the reconfigurable load impedance comprising a first gyrator circuit coupled to a second gyrator circuit; and
   a first switch, wherein:
      the first gyrator circuit comprises a first feedforward transconductor having an input coupled to the output of the gm-C filter and an output coupled to one terminal of the first switch;
      the first gyrator circuit further comprises a first feedback transconductor having an input coupled to another terminal of the first switch and an output coupled to the output of the gm-C filter;
      the second gyrator circuit comprises a second feedforward transconductor having an input coupled to the output of the first feedforward transconductor; and
      the second gyrator circuit further comprises a second feedback transconductor having an input coupled to an output of the second feedforward transconductor and an output coupled to the input of the first feedback transconductor.

9. The multi-band filter of claim 8, further comprising:
   a second switch coupled in parallel with the second feedforward transconductor; and
   a third switch coupled in parallel with the second feedback transconductor.

10. The multi-band filter of claim 8, further comprising a capacitive element coupled to the output of the first feedforward transconductor or the input of the first feedback transconductor.

11. The multi-band filter of claim 10, wherein the capacitive element comprises a variable capacitive element.

12. The multi-band filter of claim 10, further comprising a resistive element coupled in parallel with the capacitive element.

13. The multi-band filter of claim 8, further comprising at least one of a capacitive element or a resistive element coupled to the output of the second feedforward transconductor and to the input of the second feedback transconductor.

14. A multi-band filter comprising:
   a transconductance-capacitance (gm-C) filter; and
   a reconfigurable load impedance coupled to an output of the gm-C filter, the reconfigurable load impedance comprising a first gyrator circuit coupled to a second gyrator circuit, wherein the multi-band filter is capable of being configured to have a frequency response with two or more non-contiguous passbands having different center frequencies.

15. A method of processing an input signal, comprising:
configuring a multi-band filter to have a first configuration, the multi-band filter comprising a transconductance-capacitance (gm-C) filter and a reconfigurable load impedance coupled to an output of the gm-C filter, the reconfigurable load impedance comprising a first gyrator circuit coupled to a second gyrator circuit;
filtering the input signal with the multi-band filter in the first configuration;
configuring the multi-band filter to have a second configuration, different from the first configuration; and
filtering the input signal with the multi-band filter in the second configuration, wherein the first gyrator circuit is coupled to the second gyrator circuit via a first switch, wherein configuring the multi-band filter to have the first configuration comprises setting the first switch to have a first position, and wherein configuring the multi-band filter to have the second configuration comprises setting the first switch to have a second position, wherein the multi-band filter is configured as a high-pass filter when the first switch is open and as a notch filter when the first switch is closed.

16. The method of claim 15, wherein:
the first gyrator circuit comprises a first feedforward transconductor having an input coupled to the output of the gm-C filter and an output coupled to one terminal of a second switch;
the first gyrator circuit further comprises a first feedback transconductor having an input coupled to another terminal of the second switch and an output coupled to the output of the gm-C filter;
the second gyrator circuit comprises a second feedforward transconductor having an input coupled to the output of the first feedforward transconductor;
the second gyrator circuit further comprises a second feedback transconductor having an input coupled to an output of the second feedforward transconductor and an output coupled to the input of the first feedback transconductor;
configuring the multi-band filter to have the first configuration comprises setting the second switch to have a first position; and
configuring the multi-band filter to have the second configuration comprises setting the second switch to have a second position.

17. The method of claim 16, wherein:
the multi-band filter further comprises a third switch coupled in parallel with the second feedforward transconductor and a fourth switch coupled in parallel with the second feedback transconductor;
configuring the multi-band filter to have the first configuration comprises setting at least one of the third switch or the fourth switch to have a first position; and
configuring the multi-band filter to have the second configuration comprises setting the at least one of the third switch or the fourth switch to have a second position.

18. The method of claim 16, wherein the multi-band filter further comprises a capacitive element coupled to the output of the first feedforward transconductor or the input of the first feedback transconductor.

19. The method of claim 16, wherein the multi-band filter further comprises at least one of a capacitive element or a resistive element coupled to the output of the second feedforward transconductor and to the input of the second feedback transconductor.

20. The method of claim 15, wherein at least one of the first gyrator circuit or the second gyrator circuit comprises a feedforward transconductor and a feedback transconductor coupled in parallel with the feedforward transconductor.

21. The method of claim 20, wherein the at least one of the first gyrator circuit or the second gyrator circuit further comprises a capacitive element coupled to at least one of an output of the feedforward transconductor or an input of the feedback transconductor.

22. The method of claim 21, wherein the multi-band filter further comprises a resistive element coupled in parallel with the capacitive element.

23. The method of claim 15, wherein the multi-band filter further comprises at least one of a shunt capacitive element or a low-pass filter, coupled to the reconfigurable load impedance.

24. The method of claim 15, wherein the multi-band filter further comprises a resistive element coupled in parallel with the reconfigurable load impedance.

25. The method of claim 15, wherein the multi-band filter further comprises a low-pass filter coupled to an input of the gm-C filter.

* * * * *